US009852873B2

(12) United States Patent
Delferriere et al.

(10) Patent No.: US 9,852,873 B2
(45) Date of Patent: Dec. 26, 2017

(54) ELECTRON CYCLOTRON RESONANCE ION GENERATOR DEVICE

(71) Applicant: COMMISSARIAT À L'ÉNERGIE ATOMIQUE ET AUX ÉNERGIES ALTERNATIVES, Paris (FR)

(72) Inventors: Olivier Delferriere, Bruyeres-le-Chatel (FR); Olivier Tuske, Palaiseau (FR); Francis Harrault, Bagnolet (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/215,829

(22) Filed: Jul. 21, 2016

(65) Prior Publication Data

US 2017/0025240 A1 Jan. 26, 2017

(30) Foreign Application Priority Data

Jul. 21, 2015 (FR) ...................................... 15 56871

(51) Int. Cl.
*H01J 27/16* (2006.01)
*H01J 27/18* (2006.01)
(Continued)

(52) U.S. Cl.
CPC ............ *H01J 27/18* (2013.01); *H01J 27/022* (2013.01)

(58) Field of Classification Search
CPC .......... H01J 27/02; H01J 27/022; H01J 27/08; H01J 27/14; H01J 27/20; H01J 27/205; H01J 37/08
(Continued)

(56) References Cited

U.S. PATENT DOCUMENTS 4,450,031 A * 5/1984 Ono ........................ C23C 14/46 118/50.1
5,620,522 A * 4/1997 Ichimura ........... H01J 37/32192 118/719
(Continued)

FOREIGN PATENT DOCUMENTS

FR 2 969 371 A1 6/2012
JP H09-055170 A 2/1997

OTHER PUBLICATIONS

Search Report as issued in French Patent Application No. 1556871, dated May 24, 2016.
(Continued)

*Primary Examiner* — Nicole Ippolito
(74) *Attorney, Agent, or Firm* — Pillsbury Winthrop Shaw Pittman LLP

(57) ABSTRACT

An electron cyclotron resonance ion generator device includes a metal tube subjected to a first potential and pierced by a first cavity forming a plasma chamber intended to contain a plasma; a second cavity forming a waveguide configured to inject a high frequency wave into the plasma chamber, an extraction system including an upstream end connected to the plasma chamber and a downstream end configured to be connected to an ion transport line, the connecting flange being subjected to a second potential, a magnetic field generator, and a ceramic tube in contact with the metal tube, the ceramic tube surrounding the metal tube and at least a part of the extraction system.

14 Claims, 3 Drawing Sheets

(51) Int. Cl.
*H01J 37/32* (2006.01)
*H01J 27/02* (2006.01)

(58) Field of Classification Search
USPC .............. 250/423 R, 424, 427, 423 P, 423 F; 315/111.01, 111.21, 111.31, 111.41, 315/111.81
See application file for complete search history.

(56) References Cited

U.S. PATENT DOCUMENTS

| | | | | |
|---|---|---|---|---|
| 2010/0033115 | A1* | 2/2010 | Cleland .................... | H05H 5/00 315/501 |
| 2013/0327954 | A1* | 12/2013 | Delferriere ............. | H01J 27/18 250/423 R |

OTHER PUBLICATIONS

Gobin, R., et al., "High intensity ECR ion source ($H^+$, $D^+$, $H^-$) developments at CEA/Saclay," Review of Scientific Instruments, vol. 73, No. 2, Feb. 2002, XP012039757, pp. 922-924.

* cited by examiner

ELECTRON CYCLOTRON RESONANCE ION GENERATOR DEVICE

CROSS-REFERENCE TO RELATED APPLICATIONS

This application claims priority to French Patent Application No. 1556871, filed Jul. 21, 2015, the entire content of which is incorporated herein by reference in its entirety.

TECHNICAL FIELD

The present invention relates to an electron cyclotron resonance ion generator device, and more precisely an ECR (electron cyclotron resonance) type ion source.

STATE OF THE PRIOR ART

In a known manner, electron cyclotron resonance devices, also known as ECR sources, are used to produce mono-charged or multi-charged ions (i.e. atoms from which one or more electrons have been torn off).

The document FR2969371 describes an electron cyclotron resonance device comprising:

- a plasma chamber intended to contain a plasma,
- means of generating a magnetic field in the plasma chamber, the plasma chamber being at a first potential, the means of generating a magnetic field being at a second potential,
- means of propagating a high frequency wave inside the plasma chamber,
- an insulating structure, the insulating structure having an upstream end that is at the first potential and a downstream end that is at the second potential, the means of generating a magnetic field being situated downstream of the insulating structure.

This device is particularly advantageous because it is very compact thanks to the presence of the insulating structure upstream of the plasma chamber, which makes it possible to reduce the total length of the device. Nevertheless, it remains relatively voluminous all the same.

Furthermore, this device comprises an accelerator tube making it possible to extract ions from the plasma chamber. To do so, the accelerator tube comprises several electrodes of which the shape is simplified compared to devices of the prior art.

Nevertheless, it has been observed that the extraction of the beam of ions is sometimes interrupted in this device. These interruptions in the extraction of the beam could be explained by the presence of Penning type discharges in the device. In fact, during certain favorable combinations of electric and magnetic field lines in the plasma chamber, Penning type discharges can appear. Yet, due to the level of vacuum reigning in the accelerator tube, particles can then be trapped between the electrodes. These particles then acquire energy and describe circular trajectories while oscillating with greater or lesser amplitude according to the levels of electric and magnetic field. These particles generally end up by hitting the electrodes of the accelerator tube which creates a flow of particles at the level of the high voltage electrical supply of the device, which causes a voltage drop. The beam of ions then can no longer be extracted from the plasma chamber.

Furthermore, the second electrode of this device of the prior art, also called "intermediate electrode" because it is polarized to an intermediate potential, has a complex geometry in order to avoid electrical breakdowns in the accelerator tube.

DESCRIPTION OF THE INVENTION

The invention aims to overcome the drawbacks of the prior art by proposing an electron cyclotron resonance ion generator device that is more compact than those of the prior art.

The invention also aims to propose a device wherein the risk of Penning type discharge is limited.

The invention also aims to propose a device simpler than those of the prior art, wherein the risk of electrical breakdown is also reduced.

To do so, a first aspect of the invention relates to an electron cyclotron resonance ion generator device comprising:

- a metal tube, the metal tube being intended to be placed at a first potential, the metal tube being pierced by:
  - a first cavity forming a plasma chamber intended to contain a plasma;
  - a second cavity connected to the first cavity, the second cavity forming a waveguide configured to inject a high frequency wave into the plasma chamber,
- extraction means configured to extract ions from the plasma chamber, the extraction means comprising an upstream end connected to the plasma chamber and a downstream end provided with a connecting flange intended to be connected to an ion transport line, the connecting flange being intended to be placed at a second potential different to the first potential,
- means of generating a magnetic field configured to generate a magnetic field in the plasma chamber,
- an insulating structure configured to insulate electrically the metal tube from the downstream end of the extraction means, the insulating structure comprising a ceramic tube in contact with the metal tube, the ceramic tube surrounding the metal tube and at least a part of the extraction means.

In this document, the terms "upstream" and "downstream" are used with respect to the direction of propagation of a beam of ions at the outlet of the plasma chamber.

The electron cyclotron resonance ion generator device according to the first aspect of the invention is particularly advantageous because it is more compact than those of the prior art given that the insulating structure is now in contact with the metal tube in which are hollowed out the waveguide and the plasma chamber. There is thus no longer an air gap between the insulating structure and the waveguide unlike devices of the prior art. Moreover, this geometry makes it possible to have a limited risk of breakdown in the device, as well as a limited risk of Penning type discharges. The extraction of the beam of ions is thus more reliable in the device according to the first aspect of the invention. Moreover, by eliminating the air gap between the insulating structure and the waveguide, the need for a pumping sleeve is eliminated, which further simplifies the device.

The device according to the first aspect of the invention may also have one or more of the characteristics hereafter taken independently or according to all technically possible combinations thereof.

Advantageously, the extraction means comprise at least:

- a first electrode integral with the metal tube, the first electrode being intended to be placed at the first potential, a third electrode downstream of the first electrode, the third electrode being intended to be placed at the second potential, a fourth electrode downstream of the third electrode, the fourth electrode being intended to be placed at a negative potential.

Advantageously, the extraction means further comprise a second electrode arranged between the first and the third electrode, the second electrode being intended to be placed at a variable potential, the second electrode being capable of being connected to means of adjusting the potential.

Advantageously, the second electrode is connected to the ceramic tube, the second electrode having an annular shape. The second electrode thus has a simpler geometry than in devices of the prior art. This simplification of the geometry of the second electrode is made possible thanks to the fact that the air gap between the insulating structure and the walls of the plasma chamber and the waveguide is eliminated.

Advantageously, the device further comprises a ceramic ring intercalated between the first and the second electrode. This ceramic ring makes it possible to maintain in place the first and the second electrodes, while reducing the risk of breakdown in the extraction means.

Advantageously, the device comprises connection means capable of connecting the second electrode to means of adjusting the potential, the connection means comprising:

a connecting plug situated outside of the ceramic tube;

a longitudinal connection conduit longitudinally traversing the ceramic tube, the connection conduit being traversed by a metal wire connecting the connecting plug to the second electrode.

According to a first embodiment, the connecting plug is situated on a lateral exterior wall of the ceramic tube, the connection means further comprising a radial connection conduit connecting the longitudinal connection conduit to the connecting plug.

According to a second embodiment, the device further comprises an inlet flange, the connecting plug being situated on an exterior wall of the inlet flange.

According to an embodiment, the ceramic tube comprises two concentric tubular parts. The longitudinal connection conduit may thus be formed by a groove hollowed out in one of the two tubular parts. The groove is preferably hollowed out in the internal tubular part. The longitudinal connection conduit is thus easier to produce, since it can be produced by hollowing out a groove on an external surface of the internal tubular part of the ceramic tube.

According to another embodiment, the ceramic tube is formed by a one-piece part.

Advantageously, the extraction means further comprise a fifth electrode downstream of the fourth electrode, the fifth electrode being intended to be placed at the second potential.

Advantageously, the connecting flange is fixed on the ceramic tube. In fact, since the device is more compact than those of the prior art, it is possible to do without an additional support flange and the device can be fixed directly to the ion transport line via the connecting flange. The device is thus shortened and the ion transport line is brought closer to the plasma chamber, which makes it possible to obtain a beam of ions of better quality in the ion transport line.

Advantageously, the device further comprises means of generating a magnetic field configured to generate a magnetic field in the plasma chamber, the means of generating the magnetic field surrounding the ceramic tube, the means of generating the magnetic field being situated at the level of the plasma chamber. Thus, unlike devices of the prior art, the means of generating the magnetic field are no longer situated at the level of the extraction means but at the level of the plasma chamber. This modification has been made possible by:

the reduction in the diameter of the insulating structure at the level of the plasma chamber thanks to the fact that the insulating structure is now in contact with the tube forming the waveguide and the plasma chamber, and by the elimination of the pumping sleeve.

This new position of the means of generating a magnetic field is particularly advantageous because it makes it possible notably:

to benefit directly in the plasma chamber from the magnetic field generated by the generation means, unlike devices of the prior art in which the magnetic field generated was not used directly but the leakage field generated since the generation means were offset with respect to the plasma chamber. The generation of the magnetic field in the device according to the invention is thus more efficient than in devices of the prior art;

to be able to connect the ion transport line directly at the outlet of the plasma chamber, which was not the case in devices of the prior art since the outlet space of the plasma chamber was occupied by the means of generating the magnetic field. A beam of better quality in the ion transport line is thus obtained since it is closer to the plasma chamber. Thus, the beam may from its extraction be guided by focusing and deviation means.

Advantageously, the metal tube is pierced by a conduit configured to enable the injection of a gas from the outside of the metal tube into the plasma chamber.

BRIEF DESCRIPTION OF THE FIGURES

Other characteristics and advantages of the invention will become clearer from reading the detailed description that follows, with reference to the appended figures, which illustrate.

For greater clarity, identical or similar elements are marked by identical reference signs in all of the figures.

DETAILED DESCRIPTION OF AT LEAST ONE EMBODIMENT

Figure 1:
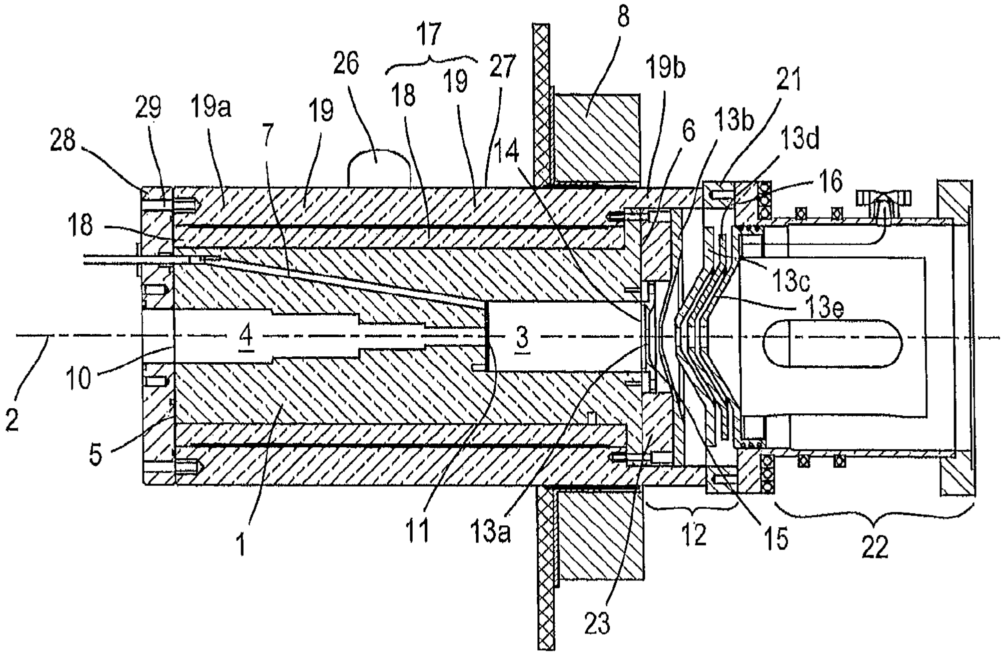
FIG. 1, a section view of a device according to an embodiment of the invention.
Figure 2:
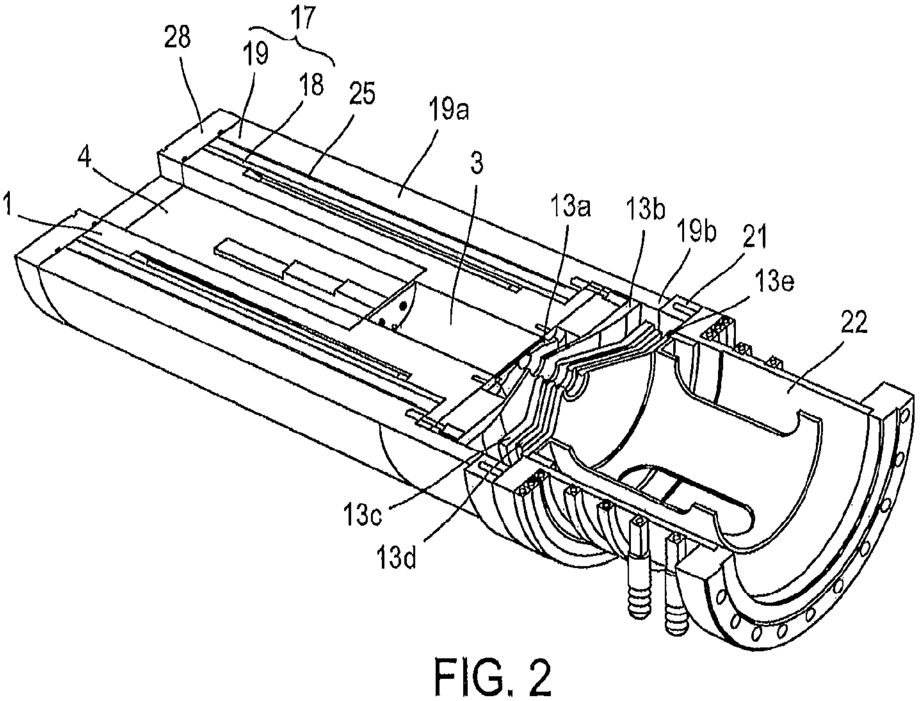
FIG. 2, a perspective view of the device of FIG. 1 in section.
Figure 3:
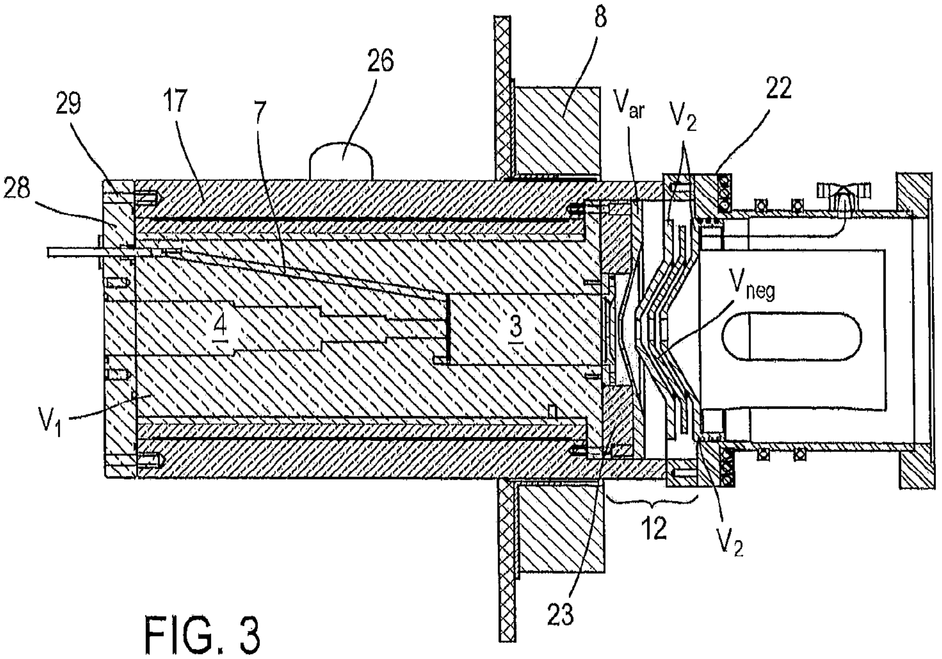
FIG. 3, an enlarged view of the device of FIG. 1 in which is represented the potential to which each zone of the device is taken.
Figure 4:
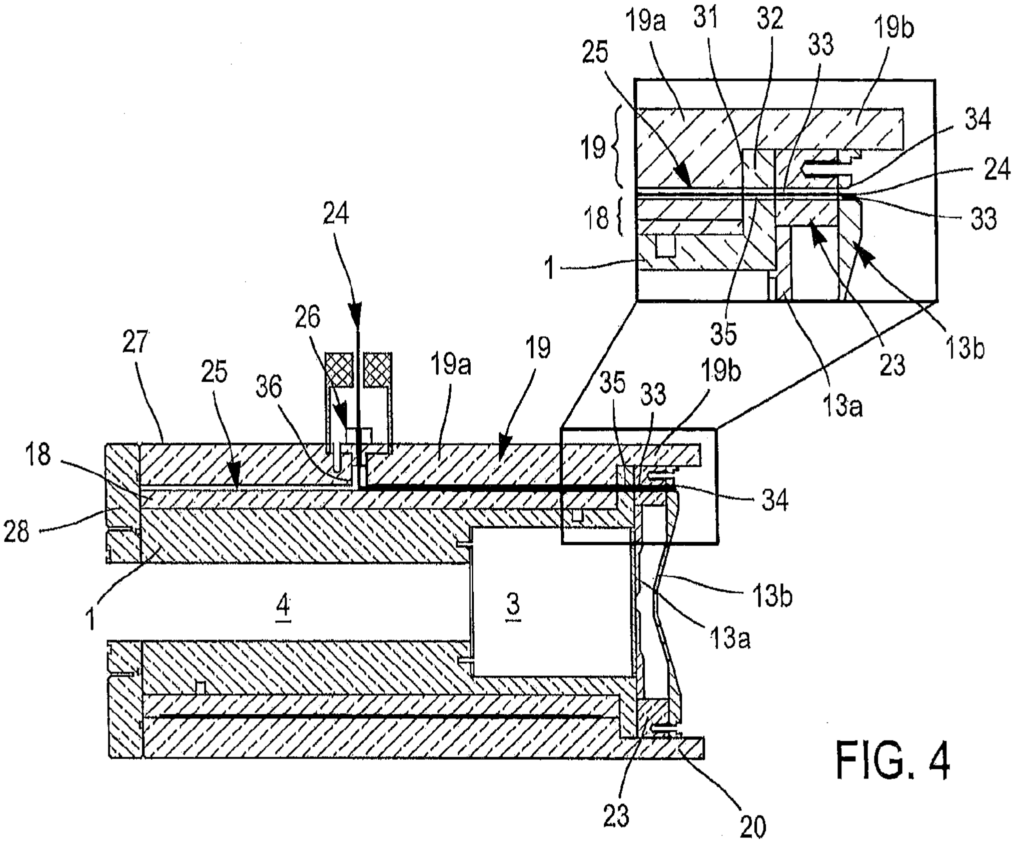
FIG. 4, an enlarged view in section of a part of the device of FIG. 1.

An electron cyclotron resonance ion generator device according to an embodiment of the invention will now be described with reference to FIGS. 1 to 5.

This device comprises a metal tube 1. The metal tube 1 extends along a reference axis 2. The metal tube 1 has a symmetry of revolution with respect to the reference axis 2. The metal tube 1 comprises an upstream end 5 and a downstream end 6. The metal tube 1 may for example be made of copper.

The metal tube 1 comprises a first cavity that forms a plasma chamber 3 intended to contain a plasma.

The metal tube 1 also comprises a second cavity that forms a waveguide 4. The waveguide 4 is intended to be crossed by a high frequency wave so as to inject it into the plasma chamber 3. A high frequency wave is a wave that has a frequency comprised between 1 and 15 GHz. The waveguide 4 comprises an upstream end 10 intended to be connected to means of generating a high frequency wave and a downstream end 11 that emerges in the plasma chamber 3. The plasma chamber 3 and the waveguide 4 are formed by a one-piece part, which simplifies the structure of the device.

The metal tube 1 is also pierced by a conduit 7 that preferably connects the plasma chamber 3 to the upstream end of the metal tube. This conduit 7 makes it possible to inject a gas into the plasma chamber 3 from the outside of the device.

The device also comprises means of generating 8 a magnetic field in the plasma chamber 3. These generation means 8 may for example comprise one or more coil(s) or permanent magnets.

In operation, the plasma chamber 3 is supplied with atoms via the conduit 7. The waveguide 4 guides a high frequency wave into the plasma chamber 3 whereas the generation means 8 generate a magnetic field in the plasma chamber 3. The coupling of this high frequency wave and this magnetic field makes it possible to obtain an electron cyclotron resonance in the plasma chamber 3. The atoms present in the plasma chamber 3 are then ionized and a plasma is obtained in the plasma chamber 3. To do so, the magnetic field in the plasma chamber 3 must have a module $B_{ecr}$ that satisfies the condition (1) of electron cyclotron resonance:

$$B_{ecr}=f{\cdot}2\pi m/e \quad (1)$$

With e the charge of the electron, m the mass of the electron and f the frequency of the high frequency wave injected into the plasma chamber.

Moreover, in order to enable the formation of ions in the plasma chamber 3, the plasma chamber 3 is placed at a first potential $V_1$. To do so, the whole of the metal tube 1 is placed at this first potential $V_1$.

The device also comprises extraction means 12 configured to extract ions from the plasma chamber 3. The extraction means 12 comprise an upstream end 15 joined to the plasma chamber 3 and a downstream end 16 intended to be joined to an ion transport line 22. The upstream end 15 of the extraction means is thus intended to be placed at the same potential as the plasma chamber 3, that is to say at the first potential $V_1$. The downstream end 16 of the extraction means is intended to be placed at the same potential as the ion transport line 22. The downstream end 16 of the extraction means is thus intended to be placed at a second potential $V_2$ different to the first potential $V_1$. The difference in potential between the first potential $V_1$ and the second potential $V_2$ is preferably comprised between 1 and 200 kV. The second potential $V_2$ is advantageously close to 0 V.

The extraction means 12 comprise;

- A first electrode 13*a* arranged at the level of the downstream end 14 of the plasma chamber 3. More precisely, the first electrode 13*a* preferably forms a metal ring integral with the downstream end 14 of the plasma chamber 3. The first electrode 13*a* is pierced by an orifice through which can pass the ions that come out of the plasma chamber 3. The first electrode 13*a* is intended to be placed at the first potential $V_1$, that is to say at the same potential as the plasma chamber 3;
- A second electrode 13*b* arranged downstream of the first electrode 13*a*. The second electrode 13*b* is preferably also formed of a metal ring pierced at its center. The second electrode 13*b* is intended to be placed at a variable potential $V_{var}$ to finely adjust the optical properties of the beam as of its formation, at the level of the extraction hole;
- A third and fifth electrodes 13*c*, 13*e* arranged downstream of the second electrode 13*b*. The third and fifth electrodes 13*c*, 13*e* are intended to be placed at the second potential $V_2$;
- A fourth electrode 13*d* arranged between the third and fifth electrodes 13*c*, 13*e*. The fourth electrode 13*d* is intended to be placed at a negative potential $V_{neg}$ with respect to the potential of the transport line in order to avoid that the electrons produced by ionization of the residual gas in the transport line return in the direction of the plasma chamber 3.

In order to insulate the parts of the device that are at different potentials, the device comprises an insulating structure. This insulating structure comprises a ceramic tube 17. This ceramic tube 17 may for example be made of alumina. The ceramic tube 17 is preferably fixed to the metal tube 1 through an annular inlet flange 28 integral with the metal tube 1. The ceramic tube 17 is preferably fixed by screws 29 to the inlet flange 28, preferably through metal inserts.

This ceramic tube 17 preferably comprises an internal tubular part 18 that surrounds the metal tube 1. The internal tubular part 18 is in contact with the metal tube 1, which makes it possible to have a device that is less bulky radially and which limits the risk of breakdown in the device. The ceramic tube also comprises an external tubular part 19 concentric with the internal tubular part 18. The external tubular part 19 preferably comprises a first cylindrical part 19*a* that surrounds the internal tubular part 18 and a second part 19*b* that surrounds at least partially at least a part of the electrodes of the extraction means 12. In this embodiment, the second cylindrical part 19*b* surrounds the first and the second electrodes 13*a*, 13*b*. The first electrode 13*a* is fixed on the metal tube 1. The second electrode 13*b* is fixed on the external tubular part 19*b*. A ceramic ring 23 is intercalated between the first and the second electrodes 13*a*, 13*b* in order to insulate them electrically from each other and in order to avoid electrical breakdowns.

The device also comprises a connecting flange 21 making it possible to fix the device to an ion transport line 22. The connecting flange 21 is fixed to the ceramic tube 17. The connecting flange 21 preferably surrounds the third, fourth and fifth electrodes 13*c*, 13*d*, 13*e*. The third, fourth and fifth electrodes 13*c*, 13*d*, 13*e* are preferably fixed on an inlet flange of the transport line 22. The third, fourth and fifth electrodes 13*c*, 13*d*, 13*e* may be separated from each other either by air gaps and insulated cross-struts, or by ceramic rings.

The device preferably comprises connection means capable of connecting the second electrode 13*b* to means of adjusting the potential. These connection means make it possible to polarize the second electrode 11*b* by connecting it to a high voltage supply.

According to an embodiment, the connection means comprise:

- a connecting plug 26 situated on a lateral exterior wall 27 of the ceramic tube 17;
- a radial connection conduit 36 formed in the ceramic tube 17;
- a longitudinal connection conduit 25 longitudinally traversing the ceramic tube 17.

The longitudinal connection conduit 25 is preferably formed by:

- a first orifice 33 hollowed out through the ceramic ring 23;

a second orifice 31 hollowed out through a collar 32 radially projecting from the metal tube 1;

a groove 30 hollowed out in the external wall of the internal tubular part 18. The connection conduit is thus easier to produce;

The longitudinal connection conduit 25 and the radial connection conduit 36 are traversed by a metal wire 24 connecting the connecting plug 26 to the second electrode 13*b*.

The metal wire 24 comprises a first end 34 pinched onto the second electrode 11*b* by means of a screw. The metal wire 24 then passes successively in the first orifice 33, the second orifice 31 and the groove 30.

The metal wire thus traverses in particular the collar 32 of the metal tube 1. Yet the metal wire 24 is not at the same potential as the collar 32. In fact, the metal wire is at the same potential as the second electrode 13*b*, whereas the collar is at the same potential as the plasma chamber. The metal wire is thus at a potential comprised between the first potential $V_1$ and the second potential $V_2$ whereas the collar 32 is at the first potential $V_1$. In order to avoid any electrical breakdown, an insulating sheath 35 is inserted into the second orifice 31. The insulating sheath 35 is thus intercalated between the collar 32 and the metal wire 24. The insulating sheath 35 is preferably formed by a glass tube. This insulating sheath 35 extends on either side of the second orifice 31, up to the parts made of alumina on either side of the collar 32 in order to avoid any risk of contact between the metal wire 24 and the collar 32.

The means of generating the magnetic field 8 preferably surround the ceramic tube 17. More precisely, the means of generating the magnetic field 8 are preferably situated at the level of the plasma chamber 3. Thus, the means of generating the magnetic field 8 preferably surround the plasma chamber 3 in order to optimize the generation of the magnetic field at the level of the plasma chamber 3.

The device thereby produced is compact longitudinally and radially. In fact, the overall volume of the device has thus been divided tenfold compared to devices of the prior art. The device moreover has a limited risk of Penning type discharge and breakdown. Moreover, it makes it possible to connect the ion transport line 22 directly at the outlet of the plasma chamber 3, which makes it possible to have a beam of better quality and more easily controllable in the ion transport line.

Naturally, the invention is not limited to the embodiments described with reference to the figures and variants could be envisaged without going beyond the scope of the invention.

Figure 5:
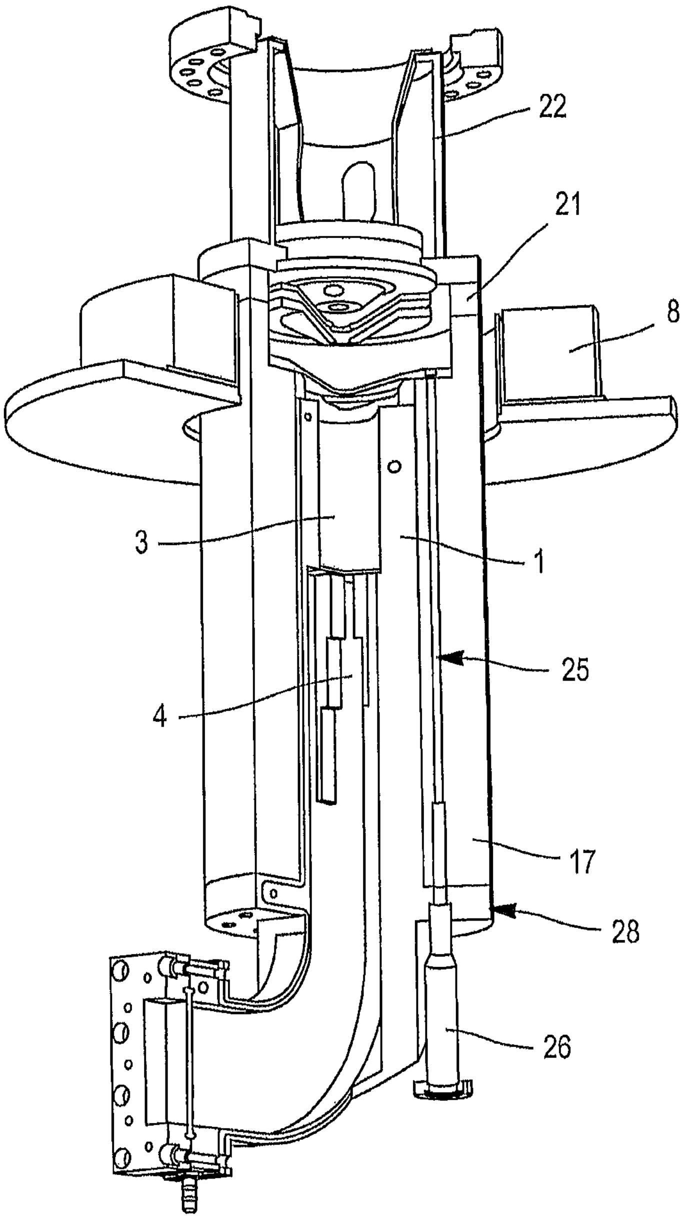
FIG. 5, a section view of a device according to another embodiment of the invention.

Thus, with reference to FIG. 5, the ceramic tube 17 could be formed from a one-piece part instead of being formed of two concentric tubular parts as represented in FIGS. 1 to 4. Furthermore, still with reference to FIG. 5, the connection means could comprise:

a connecting plug 26 situated on the inlet flange of the device;

a longitudinal connection conduit 25 longitudinally traversing the ceramic tube 17.

The invention claimed is:

1. An electron cyclotron resonance ion generator device comprising:

a metal tube, the metal tube being configured to be placed at a first potential, the metal tube being pierced by:

a first cavity forming a plasma chamber configured to contain a plasma;

a second cavity connected to the first cavity, the second cavity forming a waveguide configured to inject a high frequency wave into the plasma chamber, an extraction system configured to extract ions from the plasma chamber, the extraction system comprising an upstream end connected to the plasma chamber and a downstream end provided with a connecting flange configured to be connected to an ion transport line, the connecting flange being configured to be placed at a second potential different to the first potential, a magnetic field generator configured to generate a magnetic field in the plasma chamber, and an insulating structure configured to insulate electrically the metal tube from the downstream end of the extraction system, the insulating structure comprising a ceramic tube in contact with the metal tube, the ceramic tube surrounding the metal tube and at least a part of the extraction system.

2. The device according to the claim 1, wherein the extraction system comprises:

a first electrode integral with the metal tube, the first electrode being configured to be placed at the first potential, a third electrode downstream of the first electrode, the third electrode being configured to be placed at the second potential, a fourth electrode downstream of the third electrode, the fourth electrode being configured to be placed at a negative potential.

3. The device according to the claim 2, wherein the extraction system further comprises a second electrode arranged between the first and the third electrode, the second electrode being configured to be placed at a variable potential, the second electrode being capable of being connected to a device configured to adjust the potential.

4. The device according to claim 3, wherein the second electrode is connected to the ceramic tube, the second electrode having an annular shape.

5. The device according to claim 3, further comprising a ceramic ring intercalated between the first and the second electrode.

6. The device according to claim 3, the device comprising a connection system configured to connect the second electrode to the device configured to adjust the potential, the connection system comprising:

a connecting plug situated outside of the ceramic tube;

a longitudinal connection conduit longitudinally traversing the ceramic tube, the connection conduit being traversed by a metal wire connecting the connecting plug to the second electrode.

7. The device according to claim 6, wherein the connecting plug is situated on a lateral exterior wall of the ceramic tube, the connection system further comprising a radial connection conduit connecting the longitudinal connection conduit to the connecting plug.

8. The device according to claim 6, further comprising an inlet flange, the connecting plug being situated on an external wall of the inlet flange.

9. The device according to claim 1, wherein the ceramic tube comprises two concentric tubular parts.

10. The device according to claim 1, wherein the ceramic tube is formed by a one-piece part.

11. The device according to claim 2, wherein the extraction means system further comprises a fifth electrode downstream of the fourth electrode, the fifth electrode being configured to be placed at the second potential.

12. The device according to claim 1, wherein the connecting flange is fixed on the ceramic tube.

13. The device according to claim 1, wherein the magnetic field generator surrounds the ceramic tube, the magnetic field generator being situated at the level of the plasma chamber.

14. The device according to claim 1, wherein the metal tube is pierced by a conduit configured to enable the injection of a gas from the outside of the metal tube into the plasma chamber.

* * * * *